(12) United States Patent
Aoki et al.

(10) Patent No.: US 6,469,345 B2
(45) Date of Patent: Oct. 22, 2002

(54) SEMICONDUCTOR DEVICE AND METHOD FOR MANUFACTURING THE SAME

(75) Inventors: Takaaki Aoki, Nishikamo-gun; Yutaka Tomatsu; Akira Kuroyanagi, both of Okazaki; Mikimasa Suzuki, Toyohashi; Hajime Soga, Toyota, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/758,377

(22) Filed: Jan. 12, 2001

(65) Prior Publication Data

US 2001/0008291 A1 Jul. 19, 2001

(30) Foreign Application Priority Data

Jan. 14, 2000 (JP) ............................... 2000-010154
Jan. 21, 2000 (JP) ............................... 2000-017817

(51) Int. Cl.[7] ............................................. H01L 29/76
(52) U.S. Cl. .................... 257/330; 257/333; 257/411
(58) Field of Search ................................. 257/330, 333, 257/411

(56) References Cited

U.S. PATENT DOCUMENTS

| | | | |
|---|---|---|---|
| 4,693,781 A | | 9/1987 | Leung et al. |
| 4,839,306 A | | 6/1989 | Wakamatsu |
| 5,236,861 A | | 8/1993 | Otsu |
| 5,321,289 A | | 6/1994 | Baba et al. |
| 5,442,214 A | * | 8/1995 | Yang ........................ 257/333 |
| 5,726,088 A | | 3/1998 | Yanagiya et al. |
| 5,891,807 A | | 4/1999 | Muller et al. |
| 6,147,378 A | * | 11/2000 | Liu et al. .................... 257/333 |
| 6,201,278 B1 | * | 3/2001 | Gardner et al. ............. 257/330 |
| 6,316,807 B1 | * | 11/2001 | Fujishima et al. .......... 257/333 |

FOREIGN PATENT DOCUMENTS

| | | |
|---|---|---|
| EP | 0684637 | 11/1995 |
| JP | A-60-68650 | 4/1985 |
| JP | A-60-158642 | 8/1985 |
| JP | A-6-219759 | 11/1985 |
| JP | A-61-119056 | 6/1986 |
| JP | 62-73737 | 4/1987 |
| JP | A-62-136065 | 6/1987 |
| JP | A-62-185353 | 8/1987 |
| JP | A-62-293661 | 12/1987 |
| JP | A-63-2371 | 1/1988 |
| JP | A-63-115358 | 5/1988 |
| JP | A-63-166230 | 7/1988 |
| JP | 63-229743 | 9/1988 |
| JP | A-63-229845 | 9/1988 |

(List continued on next page.)

OTHER PUBLICATIONS

S. J. Fonash, "Damage Effects in Dry Etching", *Solid State Technology*, Apr. 1985, pp. 201–205.
U.S. patent application Ser. No. 09/630,786, Ishikawa., filed Aug. 2, 2000.

*Primary Examiner*—Mark V. Prenty
(74) *Attorney, Agent, or Firm*—Law Offices of David G. Posz

(57) ABSTRACT

A trench-gate type transistor has a gate insulating film formed on an inner wall of a trench. The gate insulating film is composed of a first portion disposed on a side wall portion of the trench and a second portion disposed on upper and bottom portions of the trench. The first portion is composed of a first oxide film, a nitride film, and a second oxide film. The second portion is composed of only an oxide film and has a thickness thicker than that of the first portion. Accordingly, electric field concentration on upper and lower corner portions of the trench can be mitigated, and a decrease in withstand voltage at that portions can be prevented.

18 Claims, 10 Drawing Sheets

FOREIGN PATENT DOCUMENTS

| | | |
|---|---|---|
| JP | A-63-278338 | 11/1988 |
| JP | 63-318768 | 12/1988 |
| JP | A-1-196134 | 8/1989 |
| JP | A-1-216538 | 8/1989 |
| JP | A-2-3956 | 1/1990 |
| JP | 2-54557 | 2/1990 |
| JP | A-2-260424 | 10/1990 |
| JP | A-2-260660 | 10/1990 |
| JP | A-2-271618 | 11/1990 |
| JP | A-2-271619 | 11/1990 |
| JP | A-2-271620 | 11/1990 |
| JP | A-3-147327 | 6/1991 |
| JP | A-3-252131 | 11/1991 |
| JP | A-4-37152 | 2/1992 |
| JP | 5-55361 | 3/1993 |
| JP | A-5-102297 | 4/1993 |
| JP | A-5-226298 | 9/1993 |
| JP | B2-5-75184 | 10/1993 |
| JP | B2-6-18248 | 3/1994 |
| JP | B2-6-24228 | 3/1994 |
| JP | B2-7-48547 | 5/1995 |
| JP | B2-2519474 | 5/1996 |
| JP | A-8-203863 | 8/1996 |
| JP | B2-2552152 | 8/1996 |
| JP | B2-2589209 | 12/1996 |
| JP | B2-2602808 | 1/1997 |
| JP | B2-2635607 | 4/1997 |
| JP | B2-2647884 | 5/1997 |
| JP | A-9-162168 | 6/1997 |
| JP | B2-2667552 | 6/1997 |
| JP | B2-2671312 | 7/1997 |
| JP | A-9-283535 | 10/1997 |
| JP | A-9-307101 | 11/1997 |
| JP | A-9-330928 | 12/1997 |
| JP | A-9-331063 | 12/1997 |
| JP | B2-2794565 | 6/1998 |
| JP | A-10-229119 | 8/1998 |
| JP | A-11-97523 | 4/1999 |
| JP | A-11-102961 | 4/1999 |

\* cited by examiner

SEMICONDUCTOR DEVICE AND METHOD FOR MANUFACTURING THE SAME

CROSS REFERENCE TO RELATED APPLICATIONS

This application is based upon and claims the benefit of Japanese Patent Applications No. 2000-10154 filed on Jan. 14, 2000, and No. 2000-17817 filed on Jan. 21, 2000, the contents of which are incorporated herein by reference.

BACKGROUND OF THE INVENTION

1. Field of the Invention

This invention relates to a semiconductor device in which a trench is formed on a semiconductor substrate with a layered film formed on an inner wall of the trench, and to a method for manufacturing the same.

2. Description of the Related Art

As this kind of device, JP-A-6-132539 discloses a transistor having a trench-gate structure in which a trench is formed on a semiconductor substrate and a gate insulating film composed of an oxide film and a nitride film is formed on an inner wall of the trench. Because the gate insulating film is composed of a compound film of the oxide film and the nitride film, the device can provide a higher gate withstand voltage than that in a case where the gate insulating film is composed of only an oxide film.

As a result of studies to the semiconductor device described above, however, it was found that an electric field was concentrated on corner portions of the upper and bottom portions of the trench to lower the withstand voltage. Further, the gate insulating film composed of the oxide film and the nitride film has many interface states. In this connection, it was further found that a threshold voltage was liable to vary due to effects of the interface states at a transistor operation state. This can lower reliability of the device.

SUMMARY OF THE INVENTION

The present invention has been made in view of the above problems. An object of the present invention is to attain a high withstand voltage in a semiconductor device having a trench-gate structure and simultaneously to prevent a decrease in withstand voltage by relaxing electric field concentration at upper and bottom portions of a trench. Another object of the present invention is to suppress variations in threshold voltage while keeping the high withstand voltage in the semiconductor device.

According to the present invention, briefly, an insulating film disposed on an inner wall of a trench has a first portion and a second portion. The first portion is composed of a first oxide film, a nitride film, and a second oxide film, and the second portion is composed of only an oxide film. Further, one of the first portion and the second portion of the insulating film is disposed on a side wall of the trench, and another one of the first portion and the second portion of the insulating film is disposed on at least one of an upper portion and a bottom portion of the trench.

Specifically, when the first portion is disposed on the side wall portion of the trench, the second portion is disposed on at least one of the upper portion and the bottom portion of the trench. Accordingly, electric filed concentration on the one of the upper portion and the bottom portion can be mitigated, and a high withstand voltage can be attained.

The first portion may be disposed only on the bottom portion of the trench. In this case, the second portion is disposed on the side wall portion of the trench. Accordingly, variations in threshold voltage can be suppressed while keeping a high withstand voltage.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

A semiconductor device according to a first preferred embodiment is explained with reference to FIG. 1, which has a transistor such as a power MOSFET, an IGBT, or the like having a trench-gate structure.

Figure 1:
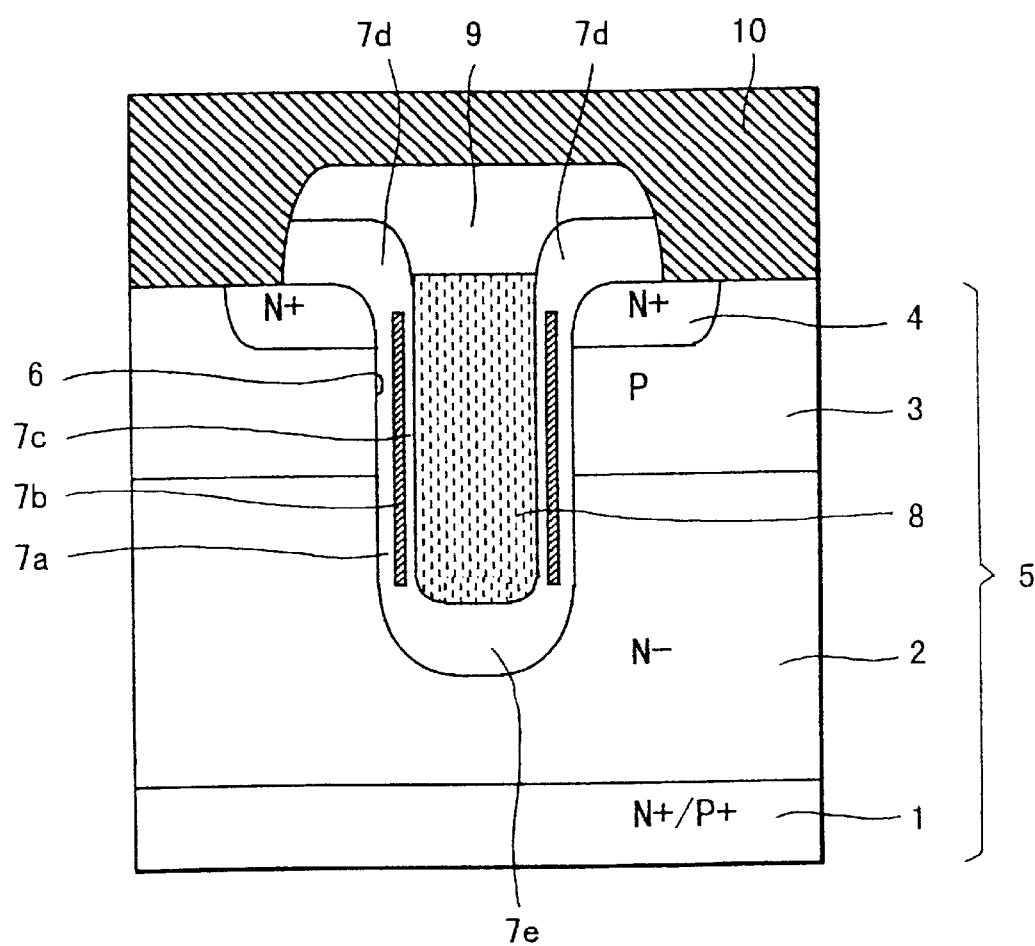
FIG. 1 is a cross-sectional view showing a semiconductor device in a first preferred embodiment of the invention.

In FIG. 1, an N⁻type drift layer 2 is formed on a P or N⁺ type silicon substrate 1, and a P type layer 3 is formed thereon as a base region. An N⁺type layer 4 is formed in the P type layer 3 to form a source region. A semiconductor substrate 5 is composed of these parts. On a main surface of the semiconductor substrate 5, a trench 6 is formed and penetrates the N⁺type layer 4 and the P type layer 3 to reach the drift layer 2. A gate insulating film is formed on an inner wall of the trench 6.

The gate insulating film is a layered film that is formed on the side wall portion of the trench 6 and a silicon oxide film 7d formed on the upper and lower portions of the trench 6. The layered film is composed of a silicon oxide film (first oxide film) 7a, a silicon nitride film 7b, and a silicon oxide film (second oxide film) 7c. The silicon nitride film 7b is positioned with an upper edge that is positioned at an upper portion than the boundary between the P type layer 3 and the N⁺type layer 4, i.e., on the main surface side of the semiconductor substrate 5. The silicon oxide films 7d, 7e formed on the upper portion and the bottom portion of the trench 6 respectively have thicknesses thicker than that of the layered film formed on the side wall portion of the trench 6. Here, the upper portion of the trench 6 is that part including the upper side corner portion of the trench 6, while the bottom portion of the trench 6 is that part including the bottom side corner portion of the trench 6.

In the trench 6, a gate electrode 8 is formed from doped polycrystalline silicon. A BPSG film 9 is formed on the surfaces (substrate main surface) of the P type layer 3 as the base region and the N$^+$type layer 4 as the source region, and a source electrode 10 and a metallic film for gate and collector electrodes (not shown in FIG. 1) are formed to be connected through contact holes formed in the BPSG film 9.

The constitution described above can provide a transistor having a gate-trench structure in which the insulating films formed on the inner wall of the trench 6 collectively form a gate insulating film, and the region of the side wall portion of the trench 6 in the P type layer 3 functions as a channel region.

Here, as the gate insulating film, the layered film composed of the silicon oxide film 7a, the silicon nitride film 7b, and the silicon oxide film 7c is formed on the side wall portion of the trench 6. This structure can provide a high withstand voltage as in a conventional one. In addition, because the silicon oxide films 7d, 7e formed on the upper and bottom portions of the trench 6 have thicknesses thicker than that of the layered film on the side wall portion of the trench 6, electric field concentration is mitigated on the upper and lower corner portions of the trench 6, thereby preventing the decrease in withstand voltage at that portions.

Next, a method for manufacturing the semiconductor device described above is explained with reference to FIGS. 2A to 2H.

Figure 2A:
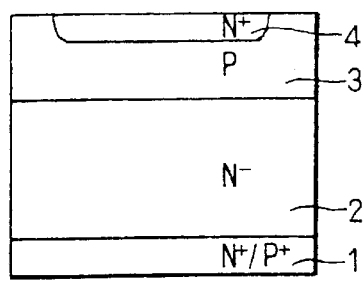
FIGS. 2A to 2H are cross-sectional view showing a method for manufacturing the semiconductor device shown in FIG. 1, in a stepwise manner.

First, in a step shown in FIG. 2A, the N$^-$type drift layer 2 is formed on the P$^+$type or N$^+$type silicon substrate 1. Then, the P type layer 3 and the N$^+$type layer 4 as the source region are sequentially formed by ion-implantation and thermal diffusion. The depth of the P type layer 3 is about 2 to 3 $\mu$m, and the depth of the N$^+$type layer 4 is about 0.5 $\mu$m.

Figure 2B:
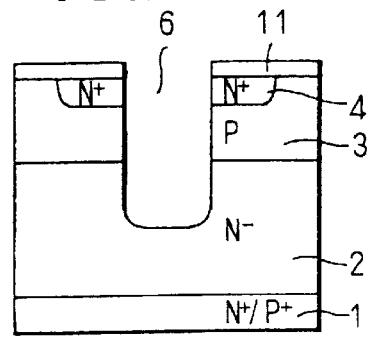

In a step shown in FIG. 2B, a silicon oxide film 11 is deposited by a CVD method as a trench mask with a thickness of about 0.5 $\mu$m, and patterning is performed thereto by photo-lithography and anisotropic dry etching. Then, the trench 6 is formed to penetrate the N$^+$type layer 4 and the P type layer 3 and to reach the drift layer 2 by anisotropic dry etching using the patterned silicon oxide film 11 as a mask. The depth of the trench 6 is about 4 to 6 $\mu$m.

Figure 2C:
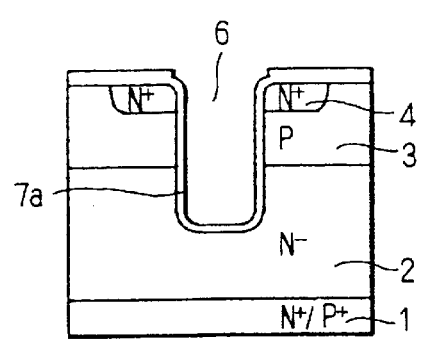

Subsequently, in a step shown in FIG. 2C, silicon exposed in the trench 6 is isotropically etched and removed at a depth of about 0.1 $\mu$m by chemical dry etching using CF$_4$ and O$_2$ gases. Then, a sacrifice oxide film of about 100 nm is formed by thermal oxidation in H$_2$O or O$_2$ atmosphere. After that, the sacrifice oxide film is removed by wet etching using dilute hydrofluoric acid. At that time, the oxide film 11 as the trench mask is simultaneously etched. The time period for the wet etching can be set at either of a time period for removing only the sacrifice oxide film and a time period for removing both the sacrifice oxide film and the silicon oxide film 11. After that, the silicon oxide film 7a is formed to have a thickness of about 100 nm by thermal oxidation performed in H$_2$O or O$_2$ atmosphere.

Figure 2D:
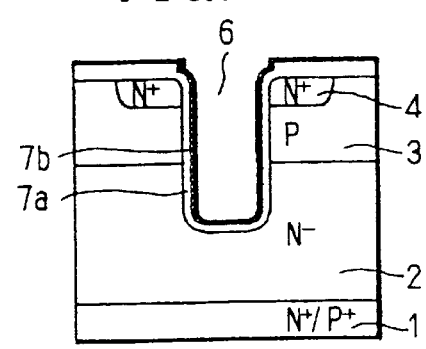

Next, in a step shown in FIG. 2D, the silicon nitride film 7b is formed to have a thickness of about 10 to 30 nm by an LPCVD method.

Figure 2E:
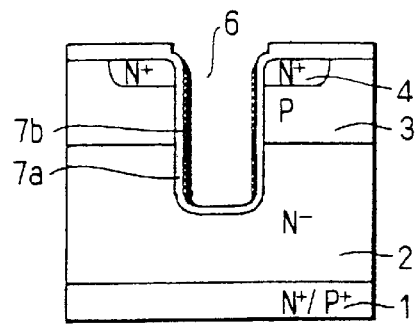

In a step shown in FIG. 2E, the part of the silicon nitride film 7b disposed on the bottom portion of the trench 6 is removed by anisotropic dry etching using gas including CHF$_3$ and O$_2$ while remaining the silicon nitride film 7b on the side wall portion of the trench 6, so that the silicon oxide film 7a is exposed. At that time, that parts of the silicon nitride film 7b formed on the upper portion of the trench 6 and on the silicon oxide film 11 on the substrate surface are removed simultaneously, and the silicon oxide film 7a is exposed at that regions.

Figure 2F:
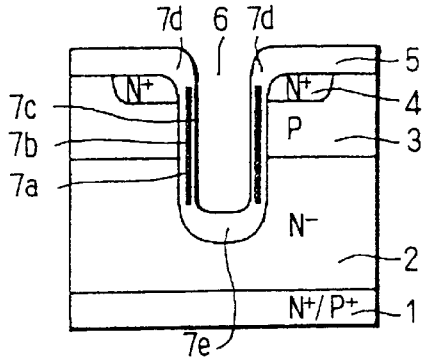

In a step shown in FIG. 2F, for example, thermal oxidation is carried out in H$_2$O or O$_2$ atmosphere at preferably 850 to 1050° C., and accordingly, the silicon oxide film 7c of about 5 to 10 nm is formed on the silicon nitride film 7b. At that time, the silicon oxide films 7d, 7e are formed on the upper and lower portions of the trench 6, where the silicon nitride film is removed, to have a thickness of about 180 to 330 nm respectively that is increased due to thermal oxidation.

In this case, because the silicon nitride film 7b is thin with a thickness of about 10 to 30 nm, the silicon oxide film can be grown on the upper portion of the trench 6 in a lateral direction after the silicon nitride film 7b is partially etched. Therefore, the thickness of the silicon oxide film can be thickened not only on the surface of the silicon substrate but also at the opening portion of the trench 6. That is, the thickness of the silicon oxide film can be thickened as well at the corner portion of the trench 6.

Figure 2G:
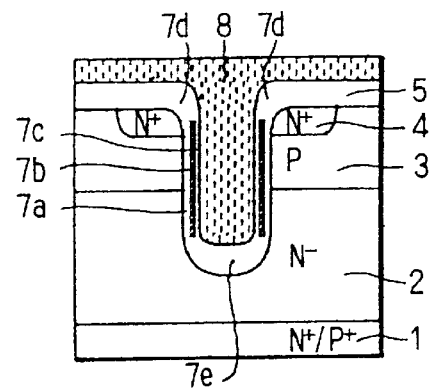
Figure 2H:
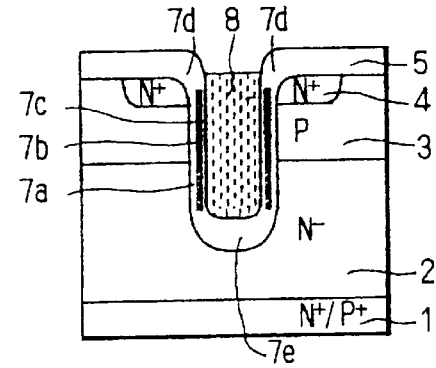

Subsequently, in a step shown in FIG. 2G, doped polycrystalline silicon 8 for the gate electrode 8 is formed by the LPCVD method, thereby filling inside the trench 6. Successively, the polycrystalline silicon 8 is etch-backed to have a desired thickness. In a step shown in FIG. 2H, then, the polycrystalline silicon 8 is patterned by photo-lithography to form the gate electrode 8.

After that, as shown in FIG. 1, the BPSG film 9 as an intermediate insulating film is formed by a plasma enhanced CVD method. The contact holes are formed in the BPSG film 9 by photo-lithography and anisotropic dry etching, and the metallic films for the source, gate and collector electrodes are formed by a sputtering method.

Thus, the semiconductor device shown in FIG. 1 is manufactured. In the method described above, an IGBT is exemplified as the semiconductor device; however, dimensions of the respective parts can be changed appropriately. For example, when a power MOSFET (DMOS) is manufactured as the semiconductor device, preferably, the depth of the trench 6 is about 2 $\mu$m, the depth of the P type layer (P well) 3 is about 1.5 $\mu$m, the depth of the N$^+$type layer 4 is about 0.5 $\mu$g m, and the thickness of the silicon oxide film 7a is about 50nm.

According to the manufacturing method described above, after the silicon oxide film 7a and the silicon nitride film 7b are formed on the inner wall of the trench 6, the silicon nitride film 7b on the upper and bottom portions of the trench 6 is removed and then thermal oxidation is performed. By performing this thermal oxidation, the silicon oxide film 7c is formed on the silicon nitride film 7b and simultaneously, the silicon oxide films 7d, 7e having large thicknesses are formed on the upper and bottom portions of the trench 6 where the silicon nitride film are removed.

Figure 3A:
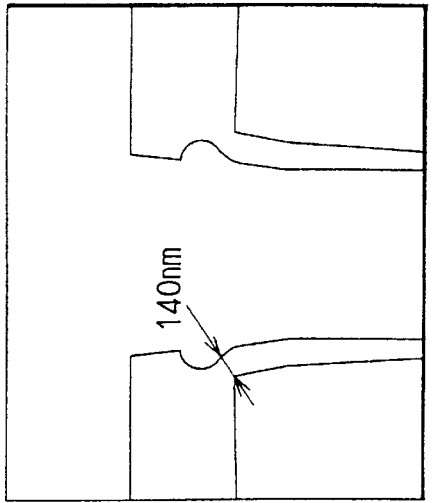
FIGS. 3A to 3D are cross-sectional view schematically showing states of upper and bottom portions of a trench formed by the method shown in FIGS. 2A to 2H, and states of upper and bottom portion of a trench formed by a conventional method as comparative examples.
Figure 3B:
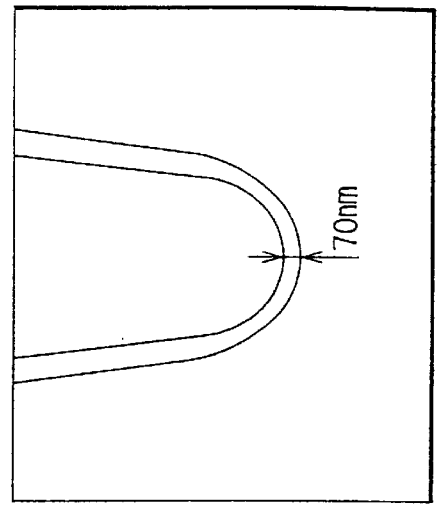
Figure 3C:
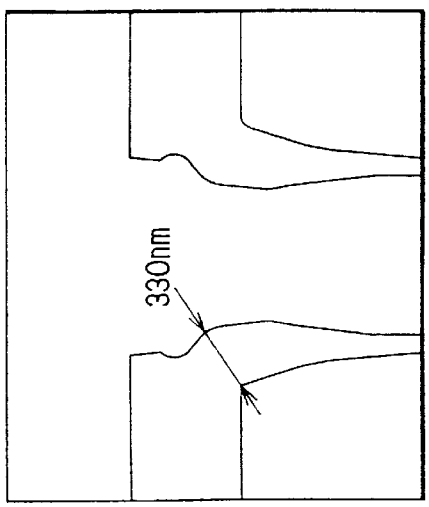
Figure 3D:
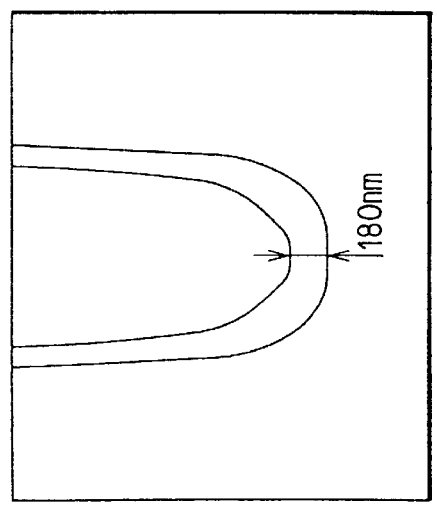

FIGS. 3A and 3B respectively show portions of the gate insulating film on the upper and lower portions of the trench manufactured by the method described above in cross-section, and illustrations of FIGS. 3A and 3B correspond to practical cross-sectional photographs. Also FIGS. 3C and 3D show portions of the gate insulating film on the upper and lower portions of the trench manufactured by a conventional method in which no removal of the silicon nitride film is performed, and illustrations of FIGS. 3C and 3D correspond to practical cross-sectional photographs. Incidentally, the difference between the examples shown in FIGS. 3A, 3B and FIGS. 3C and 3D is only that whether the removal of the silicon nitride film is performed or not, and the other manufacturing conditions are substantially identical with each other.

When the gate insulating film is formed by the conventional method, the upper and lower portions of the trench have a layered film as the gate insulating film. As shown in FIG. 3C, the thickness on the upper portion of the trench is 140 nm, while as shown in FIG. 3D, the thickness on the bottom portion is 70 nm.

To the contrary, when the gate insulating film is formed by the method according to the present embodiment described above, only the silicon oxide film exists on the upper and bottom portions of the trench. As shown in FIG. 3A, the thickness on the upper portion of the trench is 330 nm, while as shown in FIG. 3B, the thickness on the bottom portion of the trench is 180 nm.

Therefore, when the silicon nitride film on the upper and bottom portions of the trench is removed and the thermal oxidation is carried out as in the present embodiment, the electric field concentration at the corner portions of the upper and bottom portions of the trench can be relaxed, and the decrease in the withstand voltage at that portions can be prevented. Further, because the thickness of the silicon oxide film is thick at the upper and bottom portions of the trench 6, a gate input capacity can be reduced.

Figure 4:
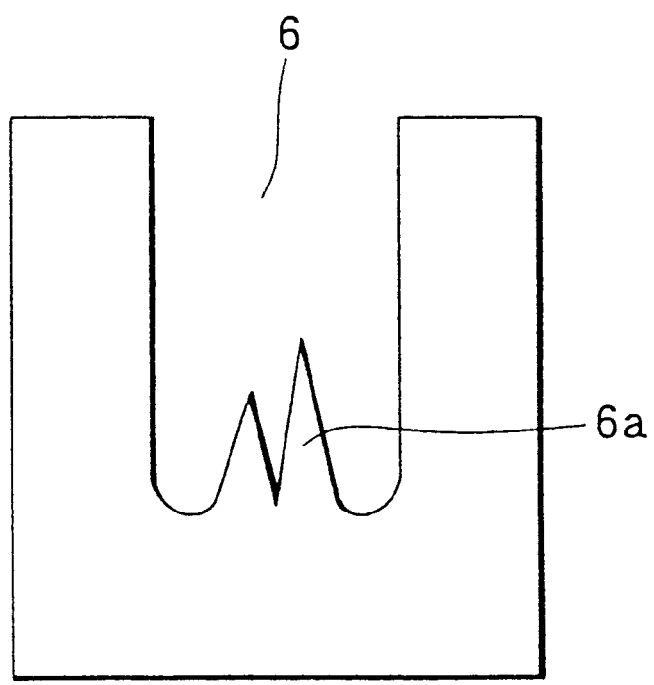
FIG. 4 is a schematic diagram for explaining silicon residues (black-Si) that can be produced at the bottom portion of the trench.

Incidentally, when the trench is formed by trench etching, as shown in FIG. 4, there is a case where silicon residues (black silicon) 6a are produced during the formation of the trench 6. When the gate insulating film is formed at the region having such columnar silicon residues 6a, electric field can locally concentrate on that portion to decrease the gate withstand voltage. Especially in power semiconductor elements such as a power MOS and an IGBT, since the gate region has a large area in a range of several dozens mm$^2$ to several hundreds mm$^2$, a probability for receiving adverse effects of the silicon residues is large.

Figure 5A:
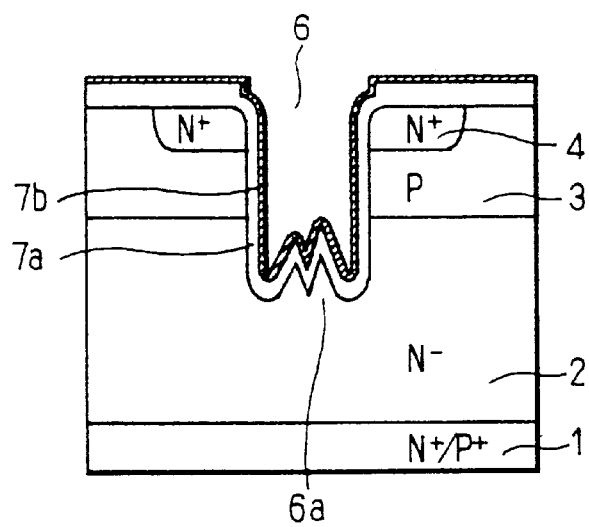
FIGS. 5A to 5c are schematic diagrams for explaining a reason why the effects of silicon residues can be suppressed by the method shown in FIGS. 2A to 2H.
Figure 5B:
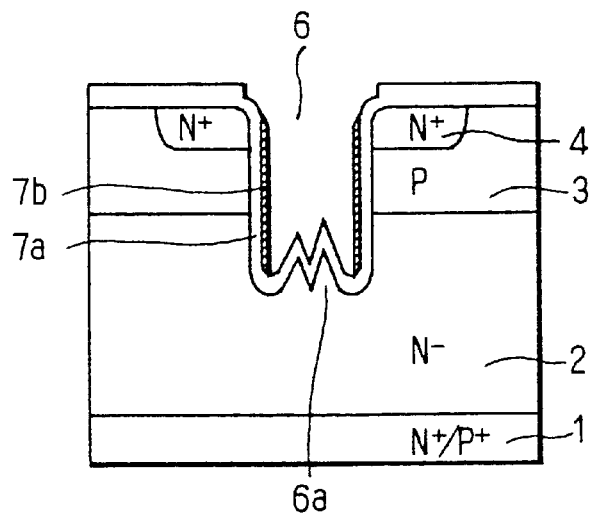

As opposed to this, according to the manufacturing method described above, the adverse effects of the silicon residues can be eliminated. Specifically, in the case where columnar silicon residues 6a are produced on the bottom portions of the trench 6, if the silicon oxide film is formed as in the conventional way, the effects of the silicon residues appear. However, in the present embodiment, even if silicon residues 6a are produced as shown in FIG. 5A, since the portions of the silicon nitride film 7b extending on the upper and bottom portions of the trench 6 are removed in the step shown in FIG. 2E, the state shown in FIG. 5B is provided.

Figure 5C:
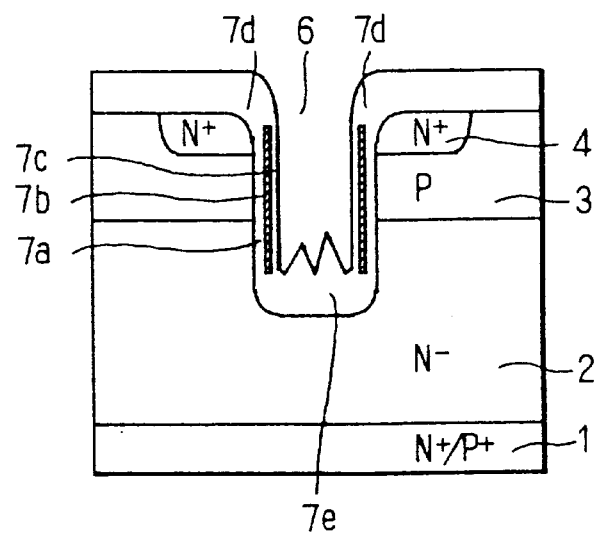

Further, because the thermal oxidation is performed in the step shown in FIG. 2F, the thick silicon oxide film 7e is formed on the bottom portion of the trench 6 to cover the entire region having the silicon residues 6a, and the state as shown in FIG. 5C is provided. Accordingly, the decrease in gate withstand voltage is suppressed at the bottom portion of the trench 6 and a high gate voltage yield can be attained.

Figure 6:
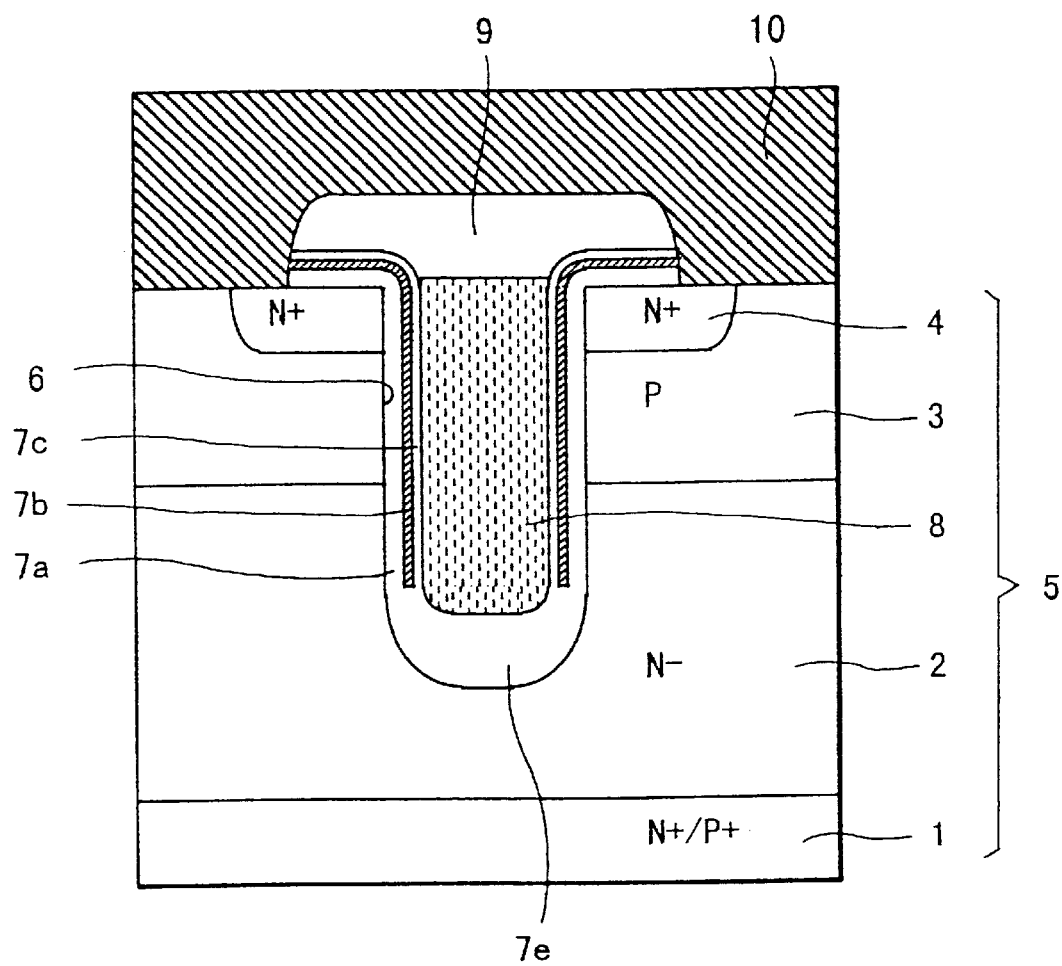
FIG. 6 is a cross-sectional view showing a semiconductor device as a modification of the first embodiment.
Figure 7:
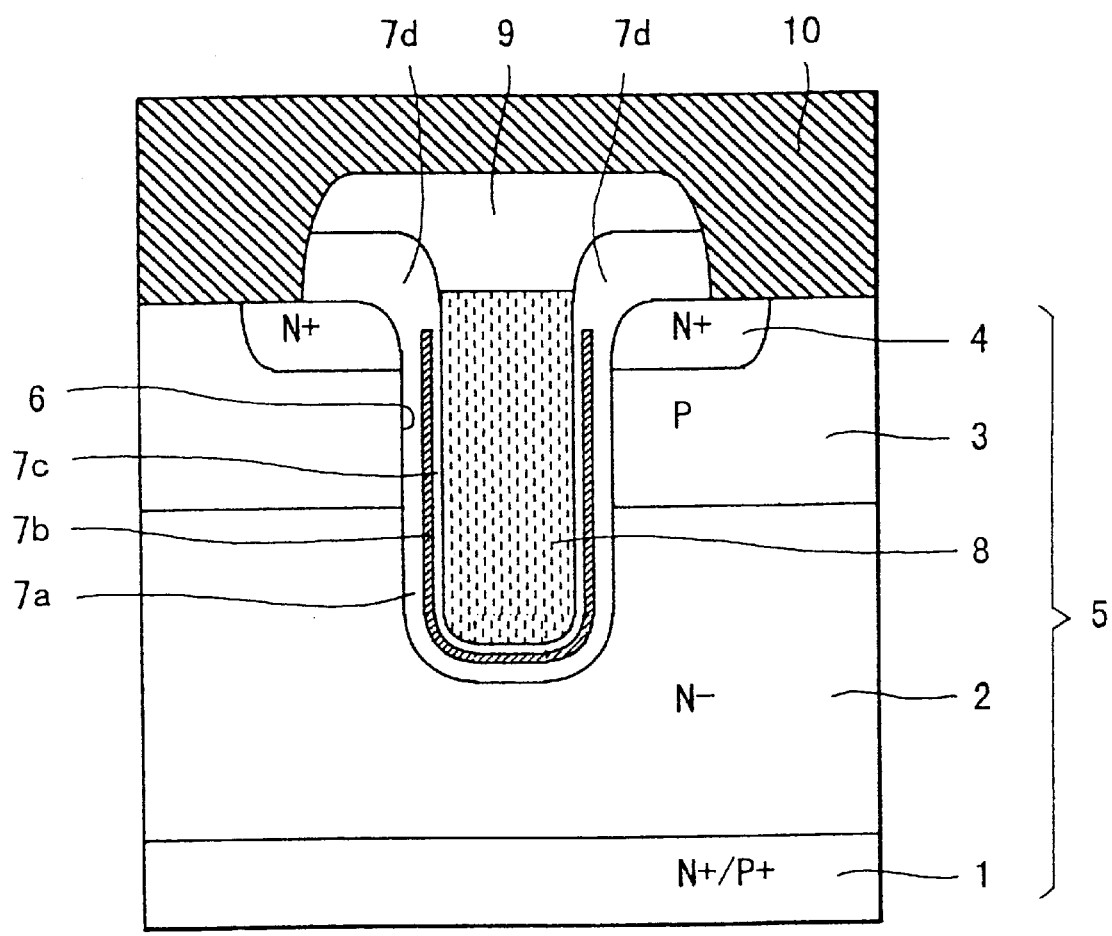
FIG. 7 is a cross-sectional view showing a semiconductor device as another modification of the first embodiment.

Incidentally, in the embodiment described above, the gate withstand voltage is enhanced by forming the insulating film on both the upper and bottom portions of the trench 6 only from the silicon oxide film; however, as shown in FIGS. 6 and 7, this countermeasure may be applied to only one of the upper and bottom portions of the trench 6, and the gate withstand voltage at another one thereof may be increased by another countermeasure. To form the single silicon oxide film at only one of the upper and bottom portions of the trench 6, for example, the portion of the silicon nitride film on another one of the upper and bottom portions is masked not to be removed during the dry-etching.

In the embodiment described above, the transistor having a trench-gate structure is exemplified as a semiconductor device; however, the withstand voltage can be increased even in other semiconductor devices such as a semiconductor device having a trench-type capacitor and a semiconductor device having an element isolation structure, by forming the insulating film on the inner wall of the trench, from the layered film of the oxide film and the nitride film on the side wall portion, and only from the oxide film on the upper portion and/or the bottom portion of the trench. The conductive type of each layer in the semiconductor device is not limited to that shown in FIG. 1, and may be inversed thereto.

Second Embodiment

Figure 8:
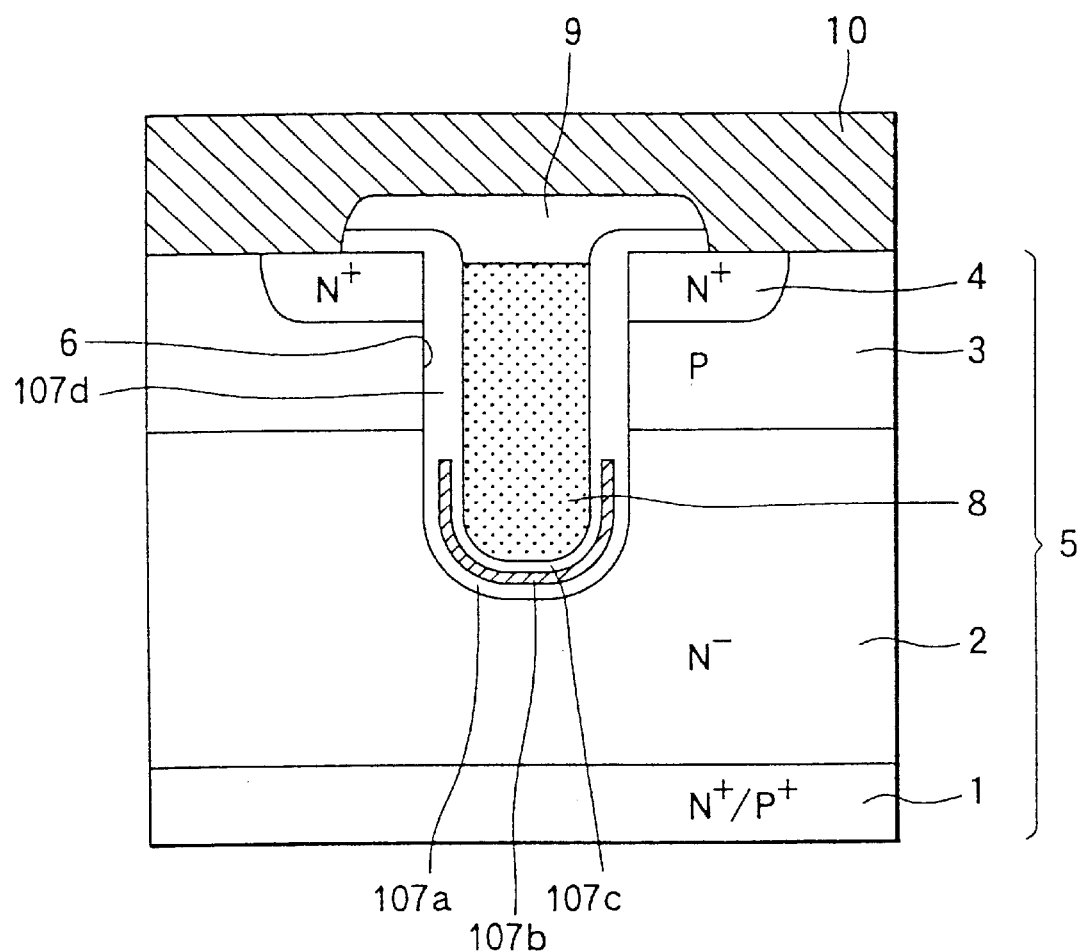
FIG. 8 is a cross-sectional view showing a semiconductor device in a second preferred embodiment of the invention.

A semiconductor device according to a second preferred embodiment is explained with reference to FIGS. 8 to 10, in which a structure of a gate insulating film is different from that in the first embodiment, and the different point is explained below. The same parts as those in the first embodiment are indicated by the same reference numerals.

The gate insulating film in the second embodiment is composed of a layered film formed on the bottom portion of the trench 6 and a silicon oxide film 107d formed on the side wall portion and the upper portion of the trench 6. The layered film is composed of a silicon oxide film 107a, a silicon nitride film 107b and a silicon oxide film 107c. The silicon nitride film 107b has an upper end that is provided at a position lower than that of the boundary between the P type layer 3 and the drift layer 2, i.e. at a back surface side of the semiconductor substrate 5.

Thus, in this embodiment, because the layered film composed of the silicon oxide film 107a, the silicon nitride film 107b, and the silicon oxide film 107c is formed on the bottom portion of the trench 6, a high withstand voltage can be attained as in a conventional one. Further, because the oxide film 7d formed on the side wall portion of the trench 6 is composed of only a silicon oxide film, variation in threshold voltage can be suppressed. As a result, the variation in threshold voltage can be decreased while maintaining a high gate withstand voltage.

Next, a manufacturing method of the semiconductor device described above is explained with reference to FIGS. 9A to 9H and 10A to 10D. Here, the steps shown in FIGS. 9A to 9D are substantially the same as those shown in FIGS. 2A to 2D, and therefore, the explanation is started from a step shown in FIG. 9E. Incidentally, the silicon oxide film 7a in FIG. 2C corresponds to the silicon oxide film 107a in FIG. 9C, and the silicon nitride film 7b in FIG. 2D corresponds to the silicon nitride film 107b in FIG. 9D.

Figure 9A:
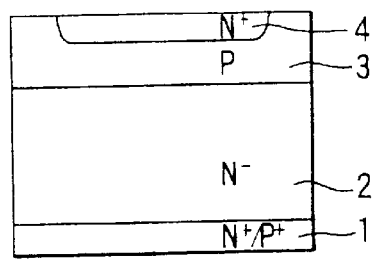
FIGS. 9A to 9H, and 10A to 10D are cross-sectional views showing a method for manufacturing the semiconductor device shown in FIG. 8 in a stepwise manner.
Figure 9B:
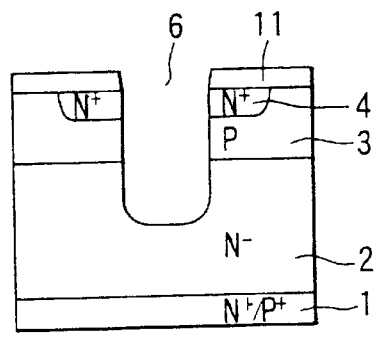
Figure 9C:
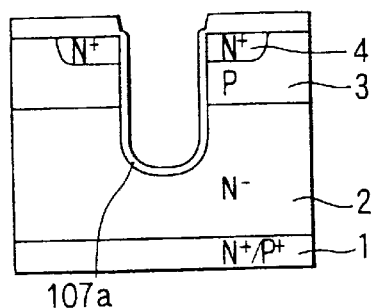
Figure 9D:
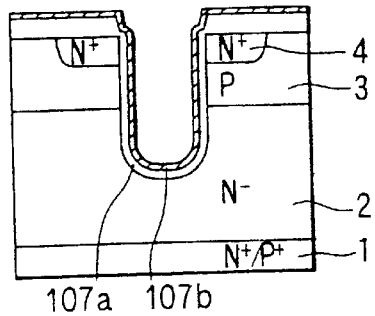
Figure 9E:
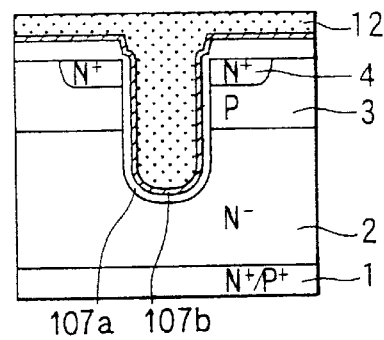

Then, in the second embodiment, in the step shown in FIG. 9E, photo-resist 12 is embedded inside the trench 6 by a rotation coating method. It should be noted that the trench 6 may be filled with a material other than the photoresist, such as poly silicon, provided that the material can serve as an etching stopper with respect to the silicon nitride film.

Figure 9F:
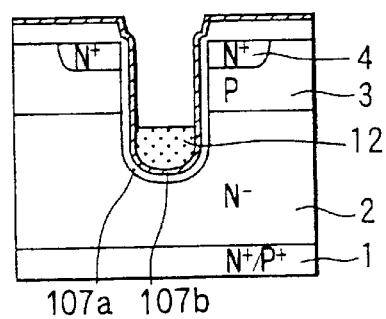

In a step shown in FIG. 9F, the photo-resist 12 is partially removed by anisotropic etch-back that is performed under conditions involving a selective ratio between the photo-resist and the silicon nitride film, and accordingly, the photo-resist 12 remains only on the bottom portion of the trench 6.

Figure 9G:
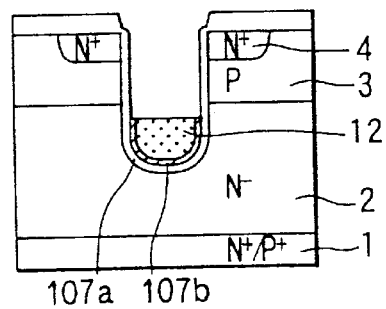
Figure 9H:
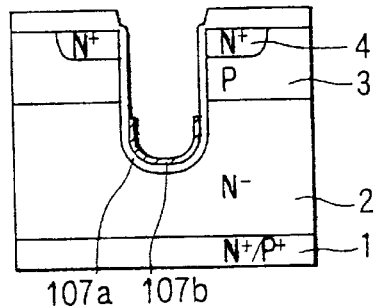

In a step shown in FIG. 9G, the silicon nitride film 107b other than the portion covered with the photo-resist 12 at the bottom portion of the trench 6, i.e., the silicon nitride film 107b disposed on the side wall portion of the trench 6 is removed by dry etching using gas including $CHF_3$ and $O_2$. At that time, the silicon nitride formed disposed on the upper portion of the trench 6 and on the silicon oxide film 11 on the substrate surface is removed simultaneously. Then, in a step shown in FIG. 9H, the photo-resist remaining at the bottom portion of the trench 6 is removed.

Figure 10A:
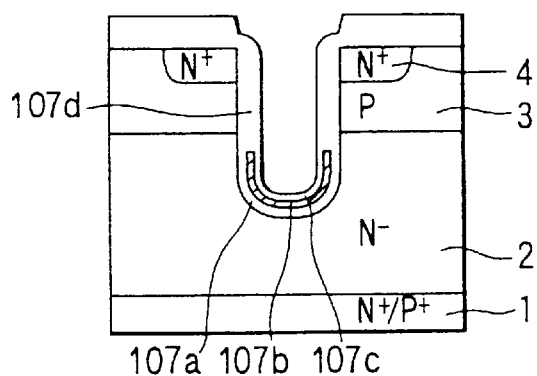

Next, in a step shown in FIG. 10A, for example, thermal oxidation is performed in $H_2O$ or $O_2$ atmosphere at 950° C. This thermal oxidation forms the silicon oxide film 107d that is thicken on the side wall portion and the upper portion of the trench 6 with a thickness of about 100 nm. At the bottom portion of the trench 6, the silicon oxide film 107c of several nm is formed on the silicon nitride film 107b.

Figure 10B:
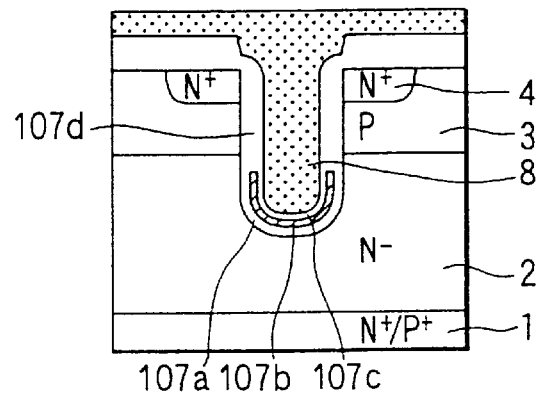
Figure 10C:
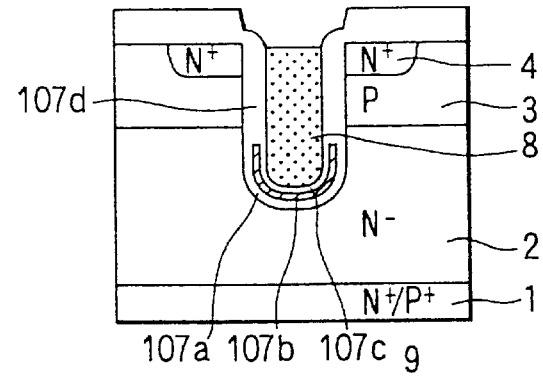

In a step shown in FIG. 10B, doped polycrystalline silicon 8 is formed by an LPCVD method for the gate electrode, thereby filling the trench 6. Successively, the polycrystalline silicon 8 is etch-backed to have a desired thickness. In a step shown in FIG. 10C, the polycrystalline silicon 8 is patterned by photo-lithography, thereby forming the gate electrode 8.

Figure 10D:
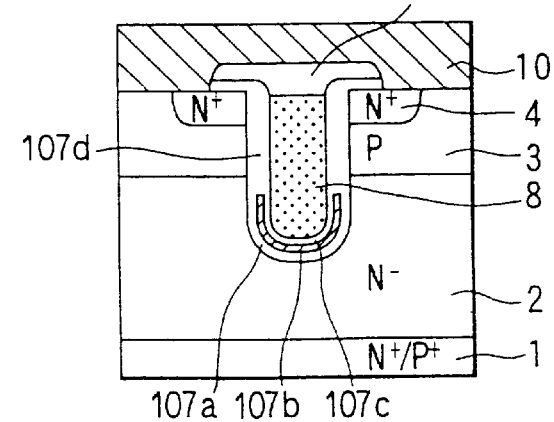

Then, in a step shown in FIG. 10D, the BPSG film 9 is formed as an intermediate insulating film by a plasma enhanced CVD method, the contact holes are formed in the BPSG film 9 by photo-lithography and anisotropic dry etching, and metallic films for the source, gate, and collector electrodes are formed by a sputtering method. Thus, the semiconductor device shown in FIG. 8 is manufactured.

According to the manufacturing method described above, after the silicon oxide film 107a and the silicon nitride film 107b are formed on the inner wall of the trench 6, the portions of the silicon nitride film disposed on the side wall portion and the upper portion of the trench 6 are removed. After that, thermal oxidation is performed to form the silicon oxide film 107c on the silicon nitride film 107b, and to form the silicon oxide film 107d on the side wall portion and the upper portion of the trench 6 where silicon nitride film is removed.

Therefore, the layered film composed of the silicon oxide film 107a, the silicon nitride film 107b, and the silicon oxide film 107c is formed on the bottom portion of the trench 6, and accordingly, a high gate withstand voltage can be attained. Also, because only the silicon oxide film 107d is formed on the side wall portion and the upper portion of the trench 6, variation in threshold voltage can be reduced. Also, the thickness of the silicon oxide film on the upper portion of the trench 6 can be increased by oxidation accelerated by the N⁺type layer 4. Because of this, the electric field concentration on the corner portion of the upper portion of the trench 6 can be relaxed and the decrease in the withstand voltage at that portion can be suppressed. Incidentally, the conductive type of each layer in the semiconductor device is not limited to that shown in FIG. 8, but may be inverted thereto.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A trench-gate type transistor, comprising:
   a semiconductor substrate having a trench formed thereon; and
   a gate insulating film disposed on an inner wall of the trench, the gate insulating film including a first portion and a second portion respectively locally disposed on the inner wall of the trench and having different structures from each other, the first portion being composed of a first oxide film, a nitride film, and a second oxide film which are layered.

2. The trench-gate type transistor according to claim 1, wherein a first region of the inner wall where the first portion of the gate insulating film is disposed includes a side wall portion of the trench in which a channel region is provided, and the first region excludes a bottom portion of the trench.

3. The trench-gate type transistor according to claim 2, wherein the first region excludes an opening portion of the trench.

4. The trench-gate type transistor according to claim 2, wherein a second region of the inner wall where the second portion of the gate insulating film is disposed includes at least one of an opening portion and the bottom portion of the trench.

5. The trench-gate type transistor according to claim 4, wherein the second portion of the insulating film disposed on the one of the opening portion and the bottom portion of the trench has a thickness thicker than that of the first portion disposed on the side wall portion of the trench.

6. The trench-gate type transistor according to claim 1, wherein:
   the first portion of the gate insulating film is disposed on a bottom portion of the trench; and
   the second portion consists of an oxide film and is disposed on a side wall portion of the trench.

7. The trench-gate type transistor according to claim 1, wherein the second portion consists of an oxide film.

8. A semiconductor device, comprising:
   a semiconductor substrate having a main surface in which a trench is formed; and
   an insulating film located on an inner wall of the trench, wherein the insulating film includes:
      a first portion composed of a first oxide film, a nitride film, and a second oxide film,
         wherein the first portion is located on the side wall of the trench; and
      a second portion consisting of an oxide film, wherein the second portion is located on both the upper portion and the lower portion of the trench, and the thickness of the second portion is larger than that of the first portion.

9. A semiconductor device, comprising:
   a semiconductor substrate having a main surface in which a trench is formed, wherein the semiconductor substrate is composed of a first conductivity type first semiconductor layer, a second conductivity type second semiconductor layer, and a first conductivity type third semiconductor layer, wherein the trench penetrates the first semiconductor layer and the second semiconductor layer to reach the third semiconductor layer; and
   an insulating film located on an inner wall of the trench, such that the semiconductor substrate provides a transistor in which the second semiconductor layer serves as a channel region, and the insulating film serves as a gate insulating film, and the insulating film includes:
   a first portion composed of a first oxide film, a nitride film, and a second oxide film, wherein the first portion is located on the side wall of the trench, and the nitride film of the first portion of the insulating film has an upper end located at a position closer to the main surface than a boundary between the first semiconductor layer and the second semiconductor layer; and a second portion consisting of an oxide film, wherein the second portion is located on at least one of the upper portion and the lower portion of the trench, and the thickness of the second portion is larger than that of the first portion.

10. A semiconductor device, comprising:

a semiconductor substrate having a main surface in which a trench is formed; and an insulating film located on an inner wall of the trench, wherein the insulating film includes:

a first portion composed of a first oxide film, a nitride film, and a second oxide film, wherein the first portion is located on the bottom portion of the trench; and a second portion consisting of an oxide film, wherein the second portion is located on the side wall of the trench.

11. The semiconductor device according to claim 10, wherein:

the semiconductor substrate is composed of a first conductivity type first semiconductor layer, a second conductivity type second semiconductor layer, and a first conductivity type third semiconductor layer;

the trench penetrates the first semiconductor layer and the second semiconductor layer to reach the third semiconductor layer; and the nitride film has an upper end that is located such that the distance from the main surface to the upper end of the nitride film is greater than the distance from the main surface to a boundary between the second semiconductor layer and the third semiconductor layer.

12. A trench-gate type transistor, comprising:

a semiconductor substrate in which a trench is formed; and a gate insulating film located on an inner wall of the trench, wherein the gate insulating film includes:
  a first portion, which is located on a side wall of the trench, wherein the first portion is composed of a plurality of insulating films; and
  a second portion, which is located at least on an opening portion and a bottom portion of the trench, wherein the second portion is composed of only a single insulating film and the thickness of the second portion is greater than that of the first portion.

13. A trench-gate type transistor, comprising:

a semiconductor substrate in which a trench is formed; and a gate insulating film located on an inner wall of the trench, wherein the gate insulating film includes:
  a first portion, which is located only on a bottom region of the trench, wherein the first portion is composed of a plurality of insulating films; and
  a second portion, wherein the second portion is composed of only a single insulating film and the thickness of the second portion is greater than that of the first portion.

14. A semiconductor device comprising:

a semiconductor substrate having a main surface, wherein a trench is formed in the main surface;

an insulating film located on an inner wall of the trench, wherein the insulating film includes:

a first portion composed of a first oxide film, a nitride film, and a second oxide film, wherein the first portion is located on a sidewall of the trench; and a second portion consisting of an oxide film, wherein the second portion is located at least on an upper inlet portion the trench, and the thickness of the second portion is greater than that of the first portion.

15. The semiconductor device according to claim 14, wherein the second portion is located on both the upper inlet portion and a bottom portion of the trench.

16. The semiconductor device according to claim 15, wherein the substrate includes a trench gate type transistor structure that comprises:

a first semiconductor layer of a first conductivity type, wherein the first semiconductor layer is located at the main surface;

a second semiconductor layer of a second conductivity type, wherein the second semiconductor layer encompasses the first semiconductor layer, and wherein the trench penetrates the first and second semiconductor layers, and an upper boundary between the first portion and the second portion located at the upper inlet portion of the trench is located above a boundary between the first and second semiconductor layers;

a third semiconductor layer of the first conductivity type, wherein the third semiconductor layer is located under the second semiconductor layer, and a lower boundary between the first portion and the second portion located at the bottom portion of the trench is located below a boundary between the second and third semiconductor layers; and a gate electrode buried in the trench, wherein the insulating film serves as a gate insulating film.

17. The semiconductor device according to claim 14, wherein the substrate includes a trench gate type transistor structure that comprises:

a first semiconductor layer of a first conductivity type, wherein the first semiconductor layer is located at the main surface;

a second semiconductor layer of a second conductivity type, wherein the second semiconductor layer encompasses the first semiconductor layer, wherein a boundary between the first portion and the second portion of the insulation film is located at the upper inlet portion of the trench and above a boundary between the first and second semiconductor layers;

a third semiconductor layer of the first conductivity type, wherein the third semiconductor layer is located under the second semiconductor layer, wherein the trench is formed from the main surface into the third semiconductor layer and penetrates the first and second semiconductor layers; and a gate electrode buried in the trench, wherein the insulating film serves as a gate insulating film.

18. The semiconductor device according to claim 14, wherein oxide film of the second portion is formed by thermal oxidation that is performed for forming the second oxide film of the first portion after the first oxide film and the nitride film are formed on the side wall.

* * * * *